May 26, 1970 F. H. RENSHAW, JR 3,514,737

PRINTED CIRCUIT BOARD SOCKET CONNECTOR

Filed Feb. 21, 1968 2 Sheets-Sheet 1

INVENTOR
FLOYD HAROLD RENSHAW JR.
BY Adrian J. La Rue

May 26, 1970 F. H. RENSHAW, JR 3,514,737

PRINTED CIRCUIT BOARD SOCKET CONNECTOR

Filed Feb. 21, 1968 2 Sheets-Sheet 2

INVENTOR
FLOYD HAROLD RENSHAW JR.
BY Adrian J. LaRue

United States Patent Office 3,514,737
Patented May 26, 1970

3,514,737

PRINTED CIRCUIT BOARD SOCKET CONNECTOR

Floyd Harold Renshaw, Jr., Hershey, Pa., assignor to AMP Incorporated, Harrisburg, Pa.

Filed Feb. 21, 1968, Ser. No. 707,059
Int. Cl. H01r *17/18, 13/40*
U.S. Cl. 339—17 6 Claims

ABSTRACT OF THE DISCLOSURE

A socket connector for printed circuit boards comprises a dielectric housing in which electrical contacts are carried in spaced and insulated relationship, the axes of the contacts being coextensive, the contacts being secured in the housing and provided with sections for engagement with conductive paths on a printed circuit board.

This invention relates to electrical connectors and more particularly to socket connectors for printed circuit boards.

Some components that are to be connected to circuitry or circuit paths of a printed circuit board require special consideration as a result of their specific nature and configuration since they are not of the conventional component variety, e.g. transistors, resistors, capacitors, IC's, etc. The present invention is directed toward the provision of a socket connector for use on a printed circuit board and it carries at least two contacts in a dielectric housing in spaced and insulated relationship thereby for connection with separate contact members of a component to be disposed in this connector.

An object of the invention is to provide a socket connector for use on a printed circuit board having a dielectric housing carrying contacts in spaced and insulated relationship which are to be engaged with axially-spaced conductive parts of a component to be mounted in the housing.

Another object of the invention is the provision of a printed circuit board socket connector which permits insertion of a component to be mounted therein in an axial manner or in a direction normal to the axis of the connector.

A further object of the invention is to provide a printed circuit board connector which carries the contacts thereof in properly spaced positions for ready placement on a printed circuit board.

An additional object of the invention is the provision of a printed circuit connector which has contacts positioned at axially spaced positions along a housing and the contacts are coextensive with the longitudinal axis of the housing.

Still a further object of the invention is to provide a printed circuit socket connector which can receive substantially all of the component to be connected therein.

Other objects and attainments of the present invention will become apparent to those skilled in the art upon a reading of the following detailed description when taken in conjunction with the drawings in which there are shown and described illustrative embodiments of the invention; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

The present invention is preferably used to connect a detonator device D in position on a printed circuit board but the connector of the present invention can, of course, be used to interconnect electrical components of the same general configuration such as, for example, fuse means, onto a printed circuit board. Detonator device D has a generally cylindrical configuration comprising a contact member 1 and a contact member 2 which extends outwardly in an insulated manner from one end of contact member 1, both contact members being coextensive with the longitudinal axis of the detonator device in a coaxial manner and axially spaced relative to one another. An explosive charge is disposed within the detonator device and is adapted to be fired by an electrical current completed through the contact members. The detonator device is a commercially available item and is manufactured by Atlas Chemical Industries, Inc.

Figures 3, 4:
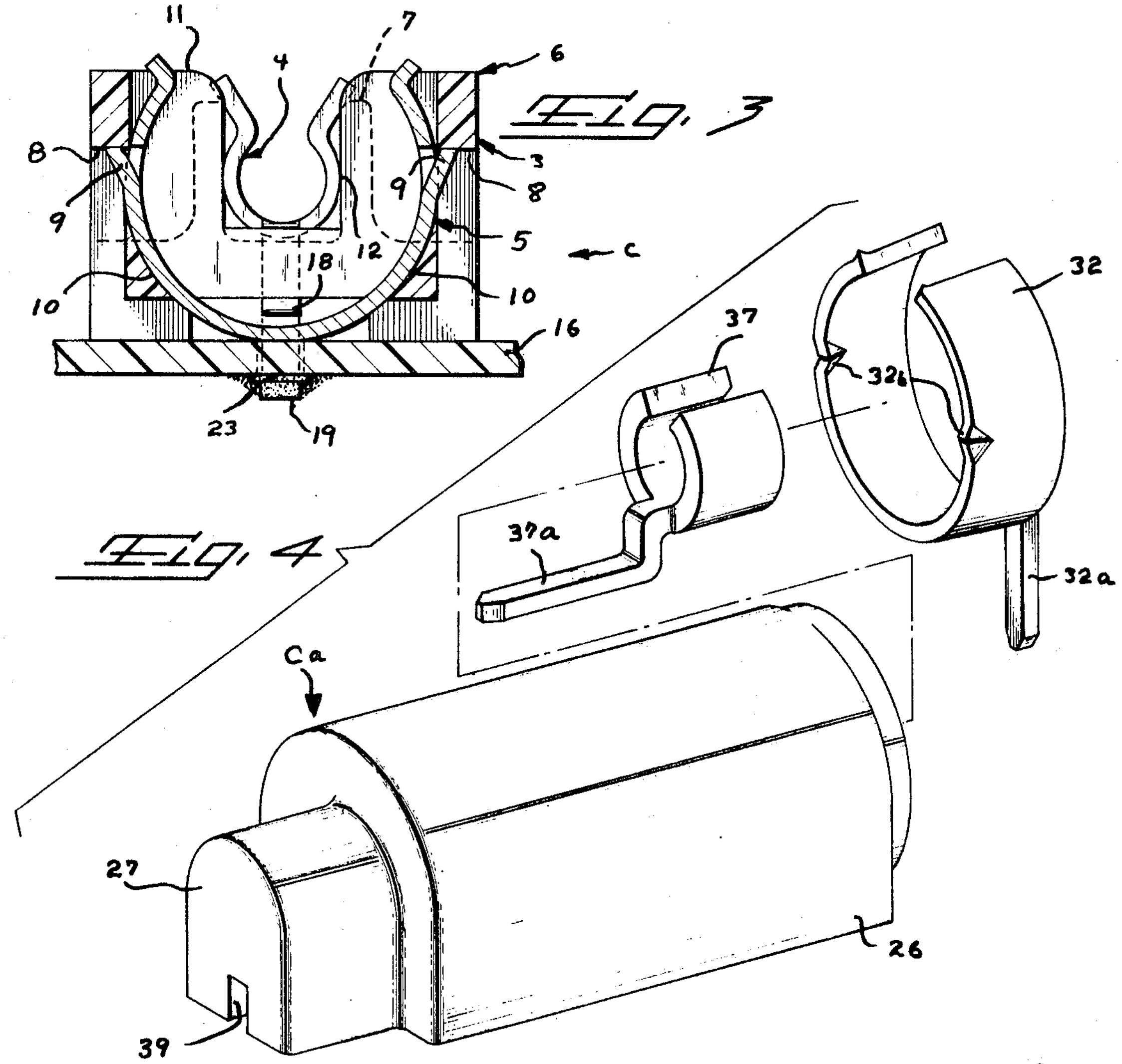
FIG. 3 is a view taken along lines 3—3 of FIG. 2.
FIG. 4 is an exploded perspective view of an embodiment of the invention.

Detonator device D is mountable in a printed circuit board socket connector C which comprises a dielectric housing 3 and electrical contacts 4 and 5, contact 4 being smaller than contact 5 and being disposed in housing 3 in a coaxial manner. Housing 3 is formed in accordance with conventional molding techniques from any suitable dielectric material such as, for example, nylon, polypropylene, or the like. Housing 3 is comprised of a large contact-receiving section 6 and a small contact-receiving section 7. The bottom of section 6 is open so that the bottom section of U-shaped contact 5 extends therein as illustrated in FIG. 3, and the sides of section 6 are provided with openings 8 which receive locking lances 9 struck out from the legs of contact 5 to secure contact 5 in position in section 6. Inner areas 10 of the inside surfaces of the sidewalls of section 6 are arcuate-shaped conforming to the configuration of contact 5 and against which contact 5 engages when lances 9 are disposed in openings 8, as illustrated in FIG. 3.

End wall 11 separates sections 6 and 7 and is provided with a recess 12 therein. The sidewalls are provided with shoulders 13, end wall 11 and shoulders 13 limit the axial movement of contact 5 in section 6. Contact 5 is provided with a lug 14 which is extendable through an opening 15 in a printed circuit board 16 and this lug is bent into engagement and soldered to conductive path 17 on the printed circuit board. The free ends of contact 5 are bent outwardly to provide ease of engagement of contact member 1 therewithin.

Contact 4 has a U-shaped configuration and its is provided with lugs 18 and 19 extending outwardly from opposite ends thereof, lug 18 being shorter than lug 19. Lug 18 is disposed within an opening 20 in housing 3 and it is bent into engagement therewith to secure contact 4 in position between the walls of contact-receiving section 7, lug 19 being disposed within a recess 21 of housing 3 and extending through an opening 22 in printed circuit board 16 and bent into engagement with circuit path 23 and soldered thereto. The free ends of contact 4 are bent outwardly to facilitate the insertion of contact member 2 therewith.

Housing 3 is provided with extensions 24 extending outwardly in a parallel manner from section 6 and connected together at the outer ends by section 25. Extensions 24 and section 25 serve to receive the part of detonator device D that extends outwardly from section 6 and section 25 prevents the detonator device from backing out from engagement with at least contact 4. The embodiment of FIGS. 1 through 3 permits detonator device D to be inserted in position in the printed circuit board socket connector in a direction normal to the axes of contacts 4 and 5. Dielectric housing 3 maintains contacts 4 and 5 in a coaxial and proper position so that they can be connected to the proper circuit paths on the printed circuit boards and aids in maintaining contacts 4 and 5 in engagement with the contact members of the detonator device.

Figure 1:
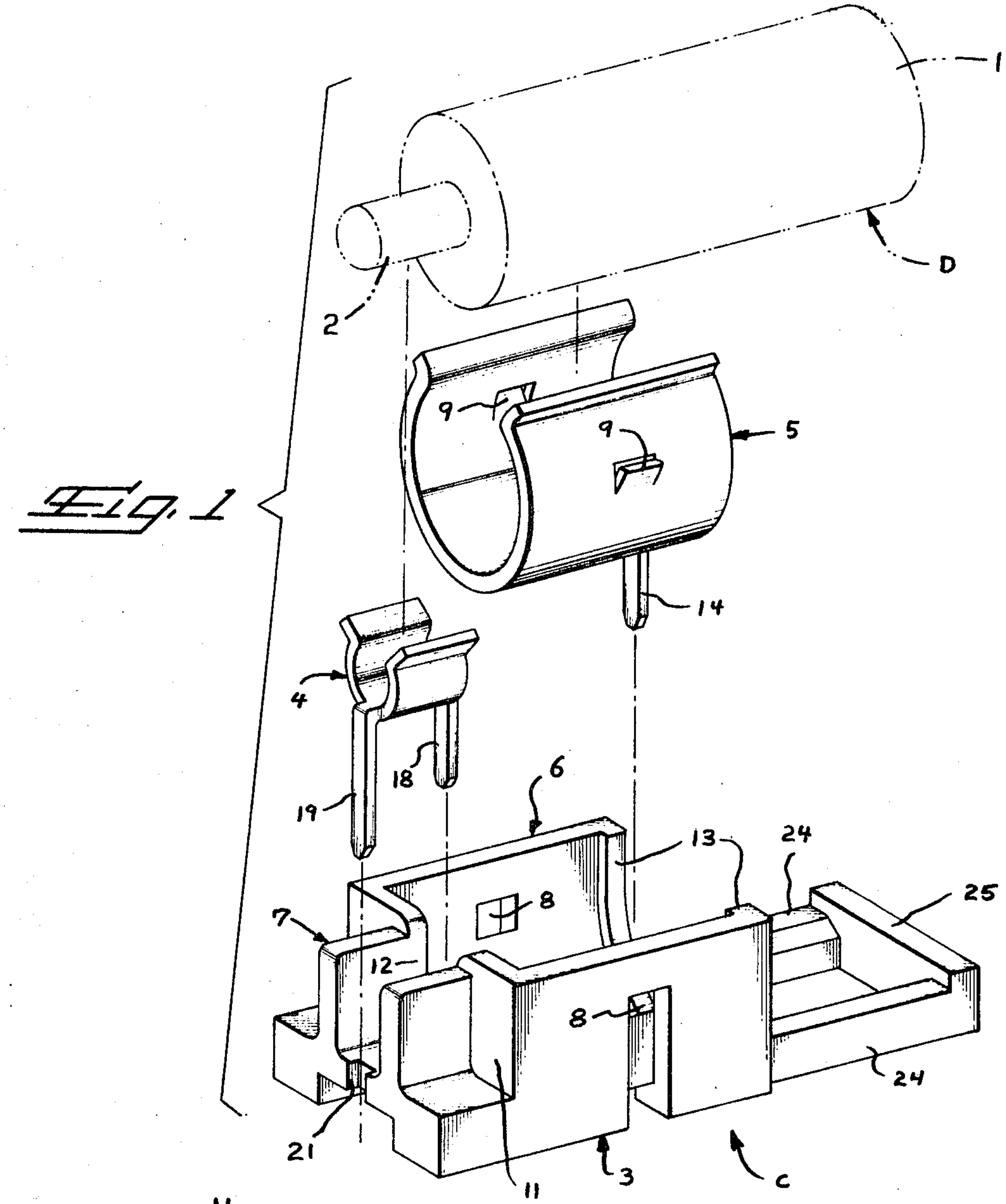
FIG. 1 is an exploded perspective view of a socket connector for printed circuit boards.
Figure 2:
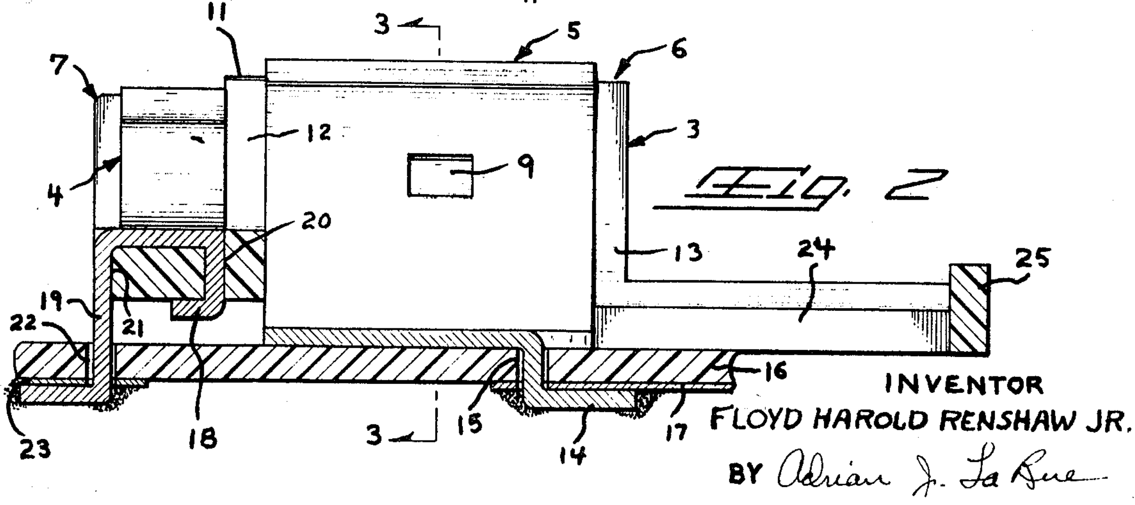
FIG. 2 is a longitudinal cross sectional view of the connector of FIG. 1 in an assembled condition and in position on a printed circuit board.
Figure 5:
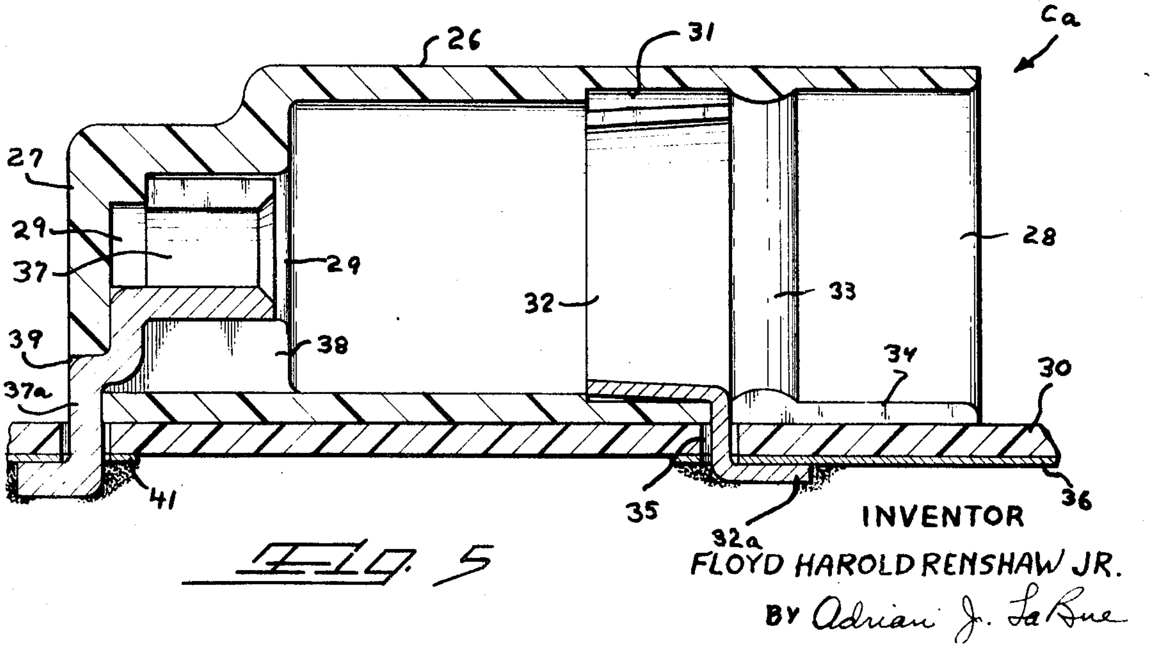
FIG. 5 is a longitudinal cross sectional view of the connector of FIG. 4 in an assembled condition and in position on the printed circuit board.

FIGS. 4 and 5 illustrate printed circuit board socket connector *Ca* which is an embodiment of the connector of FIGS. 1 through 3. Dielectric housing 26 of connector *Ca* has a quonset hut or part circular configuration which is provided with a stepped section 27 at the closed end and is molded via conventional molding practices. A bore 28 extends through housing 26 and it is in communication with bore 29 in section 27. The bottom surface of housing 26 and section 27 is planar so that housing 26 can fit on printed circuit board 30. Bore 28 is provided with a recess 31 in which electrical contact 32 is disposed. The rear wall of recess 31 is provided with an arcuate projection 33 which engages contact member 1 of detonator device D to stabilize same within housing 26. Arcuate projection 33 can be equidistantly-spaced projections instead of being continuous. A slot 34 is located in the planar floor of housing 26 to accommodate lug **32*a* of contact 32. Lug 32*a* is disposed in opening 35 of printed circuit board 30 and it is bent into engagement with circuit path 36** and secured thereto via flow-soldering techniques.

Electrical contact 37 fits into bore 29 and it includes an L-shaped lug **37*a*, the short leg of lug 37*a* being disposed in a slot 38 in communication with bore 29 to permit contact 37 to be positioned in bore 29. An opening 39 is located in the front of stepped section 27 to permit the long leg of lug 37*a* to extend outwardly therefrom during the positioning of contact 37 in bore 29 and the short leg of lug 37*a* in slot 38 whereafter the long leg of lug 37*a* is bent into opening 39 so as to extend in a direction at right angles with respect to the insertion axis of contact 37 and parallel to the short leg of lug 37*a* as illustrated in FIG. 5 so as to secure contact 37 in position in bore 29. Lug 37*a* extends through opening 40 in printed circuit board 30 and is bent into engagement with circuit paths 41 and flow-soldered thereonto. The entrance to contact 37 is beveled to facilitate the insertion of contact member 2 of detonator device D thereinto. Bore 29 is provided with a stepped section 29*a* to provide clearance for contact member 2** of detonator device D.

Electrical contacts 32 and 37 are of split ring variety and have spring characteristics to springably engage the inner and outer contact members of detonator device D so that an excellent connection is obtained. Contact 32 is beveled to wipingly engage contact member 1 of the detonator device and it is provided with inwardly-directed V-shaped projections **32*b* which score contact member 1** during the insertion of the detonator device into connector *Ca* thereby breaking down any oxide coating between the contact and the contact member to assure good electrical contact therebetween. Contact 37 is smaller than contact 32 and they are disposed in housing 26 in a coaxial position.

In both embodiments, the dielectric housing provides back-up pressure to the contacts housed therein to assure the electrical engagement between the contacts and the contact members of the detonator device. The dielectric housing also facilitates the positioning of the contacts in position on the printed circuit board to obviate the handling of individual contacts because the housing carries them as a unit instead of individually. The housing provides protection for the detonator device. The lugs of the contacts may be of sufficient length to fit into the openings of the printed circuit board and be flow-soldered onto the circuit paths without having to be bent into engagement with the circuit paths.

It will, therefore, be appreciated that the aforementioned and other desirable objects have been achieved; however, it should be emphasized that the particular embodiments of the invention, which are shown and described herein, are intended as merely illustrative and not as restrictive of the invention.

The invention is claimed in accordance with the following:

1. A printed circuit socket connector for electrical engagement with circuit paths of a printed circuit board and for electrical engagement with different sized, axially spaced contact members of a component comprising a dielectric housing having a first contact-receiving area and a second contact-receiving area, said first contact-receiving area being larger than said second contact-receiving area, said contact-receiving areas being axially spaced with respect to each other along a longitudinal axis of said housing, contact means disposed in said contact-receiving areas and having contact-engaging sections extending along said contact-receiving areas for electrical engagement with the contact members of the component and circuit path-engaging sections extending outwardly from said housing for electrical engagement with the circuit paths of the printed circuit board, and securing means provided by said contact means and said housing securing said contact means in position in said contact-receiving areas.

2. A printed circuit socket connector according to claim 1 wherein said contact means are U-shaped and they are disposed in the housing so that said component is inserted into said connector perpendicular to the longitudinal axis.

3. A printed circuit socket connector according to claim 1 wherein said contact means are of split ring configuration and said housing has a part circular configuration so that the component is positioned therein along the longitudinal axis.

4. A printed circuit socket connector according to claim 3 wherein one of said contact means is beveled and has inwardly-directed V-shaped projection means.

5. A printed circuit socket connector according to claim 1 wherein said housing has projection means adjacent one of said contact means.

6. A printed circuit socket connector according to claim 1 including, in combination, a printed circuit board having circuit paths thereon, said circuit path-engaging sections being connected to said circuit paths.

References Cited

UNITED STATES PATENTS

| | | | |
|---|---|---|---|
| 2,397,985 | 4/1946 | Schriefer. | |
| 2,459,272 | 1/1949 | Fox et al. | |
| 2,965,873 | 12/1960 | Sindelar. | |
| 3,148,010 | 9/1964 | Woodward ______ | 339—17 XR |
| 3,383,457 | 5/1968 | Schumacher et al. __ | 339—17 XR |

MARVIN A. CHAMPION, Primary Examiner

P. A. CLIFFORD, Assistant Examiner

U.S. Cl. X.R.

339—182, 217, 220